United States Patent
Sunagawa et al.

(10) Patent No.: US 7,471,309 B2
(45) Date of Patent: Dec. 30, 2008

(54) IMAGE EXPOSING APPARATUS AND IMAGE EXPOSING METHOD

(75) Inventors: Hiroshi Sunagawa, Kanagawa (JP); Yasunori Narukawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 847 days.

(21) Appl. No.: 11/087,583

(22) Filed: Mar. 24, 2005

(65) Prior Publication Data

US 2005/0234346 A1    Oct. 20, 2005

(30) Foreign Application Priority Data

Mar. 25, 2004    (JP) .............................. 2004-089678

(51) Int. Cl.
*B41J 2/435*    (2006.01)
*B41J 2/47*    (2006.01)

(52) U.S. Cl. ...................................... 347/248; 347/234

(58) Field of Classification Search ......... 347/234–235, 347/239, 248–250, 255
See application file for complete search history.

(56) References Cited

U.S. PATENT DOCUMENTS

| | | | |
|---|---|---|---|
| 5,986,688 A * | 11/1999 | Schaaf | ........................ 347/252 |
| 6,275,514 B1 | 8/2001 | Katzir et al. | |
| 6,784,912 B2 * | 8/2004 | Beier et al. | .................. 347/238 |
| 6,972,268 B2 * | 12/2005 | Ehrmann et al. | ............ 438/795 |

FOREIGN PATENT DOCUMENTS

JP    2002-523905 A    7/2002

* cited by examiner

*Primary Examiner*—Hai C Pham
(74) *Attorney, Agent, or Firm*—Sughrue Mion, PLLC

(57) ABSTRACT

An image exposing apparatus two-dimensionally scans a printing plate precursor with a light beam modulated based on an image signal to carry out image exposure on the printing plate precursor. The image exposing apparatus includes exposing device for emitting a light beam in a pulsed form with a predetermined pulse repetition period onto the printing plate precursor; branching device for branching at least a part of the light beam emitted from the exposing device; a pulse stretcher for stretching a pulse width of a branch beam branched by the branching device; synchronous signal generator for generating a synchronous signal synchronized with the pulse repetition period of the light beam from the branch beam having the pulse width stretched by the pulse stretcher; and modulating device for modulating the light beam emitted from the exposing device with an image exposure period synchronized with the synchronous signal.

2 Claims, 3 Drawing Sheets

IMAGE EXPOSING APPARATUS AND IMAGE EXPOSING METHOD

This application claims priority on Japanese patent application No. 2004-089678, the entire contents of which are hereby incorporated by reference. In addition, the entire contents of literatures cited in this specification are incorporated by reference.

BACKGROUND OF THE INVENTION

The present invention relates to an apparatus and method for image exposure used in a CTP (Computer to Plate) system, a film setter subjecting a lith film to image exposure, or an apparatus for manufacturing a printed circuit board (hereafter referred to as "PCB"), in which a wavelength conversion ultraviolet laser (hereafter referred to as "wavelength conversion UV laser") of a pulse-driven type is employed.

Currently, regarding a wavelength conversion UV laser, it is generally considered that, in order to subject an infrared (hereinafter referred to as "IR") laser beam to nonlinear wavelength conversion at high efficiency, the IR laser is desirably pulse-driven to increase the peak power. Under the present circumstances, an IR laser which has a pulse repetition frequency of 80 MHz (a pulse repetition period of 12.5 nanoseconds (ns)) and has a pulse width of 12 picoseconds (ps) is used for image exposure of a presensitized plate (PS plate) or the like.

When the above-mentioned IR laser is used for the image exposure of a PS plate or the like, if the pulse repetition period (pulse repetition frequency) interferes with the image exposure period (data frequency) of the scanning exposure, it becomes impossible to carry out a proper image exposure. Then, the image exposure period and the pulse repetition period need to be synchronized.

However, the IR laser which is currently used for the image exposure, as described above, has a high pulse repetition frequency of 80 MHz, and has a very narrow pulse width of 12 picoseconds.

For this reason, such a high performance as a sampling frequency of about 100 GHz is required for a photoelectric conversion device used for synchronization with the pulse repetition period of the IR laser, and an electronic circuit for generating a synchronous signal based on the output from the photoelectric conversion device. As a result, there is a problem in that the photoelectric conversion device and the electronic circuit become expensive to increase the total cost.

Then, there is proposed a technique for preventing a loss of synchronism between the image exposure period and the pulse repetition period of a pulsed laser by increasing the pulse repetition period (refer to JP 2002-523905 A for example).

The laser repetition rate multiplier (hereinafter referred to as "repetition multiplier") disclosed in JP 2002-523905 A is a device in which, after one beam emitted from a pulsed infrared laser is split into a plurality of split beams to which are given different delay times, respectively, the split beams are combined into a single beam, thereby reducing the peak power of the resultant beam to increase the pulse repetition period. In the repetition multiplier disclosed in JP 2002-523905 A, a pulse repetition frequency of 80 MHz is, for example, quadrupled to 320 MHz, thereby suppressing the interference between the pulse repetition period and the image exposure period of the scanning exposure.

However, in the case of the repetition multiplier disclosed in JP 2002-523905 A, optical path differences are provided using a plurality of mirrors to give the different delay times to the split beams, respectively, thereby delaying the split beams. For this reason, there is a problem in that the device construction becomes complicated.

In addition, in order to combine the split beams, high assembly precision is required for the constituent elements such as a lens and a mirror. As described above, the repetition multiplier disclosed in JP 2002-523905 A involves a problem in that since the device construction becomes complicated and the high assembly precision is also required, the cost is increased.

Moreover, for equalization of the peak output of all the split beams, the reflectivity and the transmittance of the mirrors need to be set to their respective, predetermined values. Thus, a high quality is required also for the elements constituting the device.

SUMMARY OF THE INVENTION

The present invention has been made in order to solve the above-mentioned problems associated with the related art, and it is, therefore, an object of the present invention to provide an image exposing apparatus and method capable of synchronizing an image exposure period and a pulse repetition period of a laser beam used for exposure with a simple construction requiring no complicated apparatus so as to carry out image exposure.

In order to attain the above-mentioned objects, a first aspect of the present invention provides an image exposing apparatus for two-dimensionally scanning a printing plate precursor with a light beam modulated based on an image signal to carry out image exposure on the printing plate precursor, the image exposing apparatus comprising: exposing means for emitting a light beam in a pulsed form with a predetermined pulse repetition period onto the printing plate precursor; branching means for branching at least a part of the light beam emitted from the exposing means; a pulse stretcher for stretching a pulse width of a branch beam branched by the branching means; synchronous signal generating means for generating a synchronous signal synchronized with the pulse repetition period of the light beam from the branch beam having the pulse width stretched by the pulse stretcher; and modulating means for modulating the light beam emitted from the exposing means with an image exposure period synchronized with the synchronous signal.

In order to attain the above-mentioned objects, a second aspect of the present invention provides an image exposing method for two-dimensionally scanning a printing plate precursor with a light beam modulated based on an image signal to carry out image exposure on the printing plate precursor, the image exposing method comprising the steps of: branching at least a part of the light beam to be emitted in a pulsed form with a predetermined pulse repetition period to generate a branch beam; stretching a pulse width of the branch beam; detecting the branch beam having a stretched pulse width; generating a synchronous signal synchronized with the light beam emitted in the pulsed form with the predetermined pulse repetition period based on the detected branch beam; and modulating the light beam with an image exposure period synchronized with the synchronous signal.

According to the image exposing apparatus of the present invention, the branching means for branching at least a part of a light beam used for image exposure; the pulse stretcher for stretching a pulse width of the branch beam obtained through the branch by the branching means; and the synchronous signal generating means for detecting the branch beam having the pulse width stretched by the pulse stretcher to generate a synchronous signal synchronized with the light beam which is emitted in a pulsed form with a predetermined pulse repetition period are provided, whereby it is possible to obtain a synchronous signal synchronized with the pulse repetition period of the light beam. Thus, the image exposure can be carried out by synchronizing the pulse repetition period of the light beam with the image exposure period, without their interference with each other. As a result, since a proper image exposure can be carried out, an image to be reproduced with a printing plate can be reproduced at a suitable density, and hence the image quality can be enhanced.

According to the image exposing method of the present invention, at least a part of a light beam used for image exposure is branched; a pulse width of the branch beam obtained through the branch is stretched; and the branch beam having the stretched pulse width is detected, whereby it is possible to obtain a synchronous signal synchronized with the pulse repetition period of the light beam which is emitted in a pulsed form with a predetermined pulse repetition period. Thus, the image exposure can be carried out by synchronizing the pulse repetition period of the light beam with the image exposure period, without their interference with each other. As a result, since a proper image exposure can be carried out, an image reproduced with a printing plate can be reproduced at a suitable density, and hence the image quality can be enhanced.

DETAILED DESCRIPTION OF THE PREFERRED EMBODIMENT

An image exposing apparatus and an image exposing method of the present invention will hereinafter be described in detail based on preferred embodiments shown in the accompanying drawings.

Figure 1:
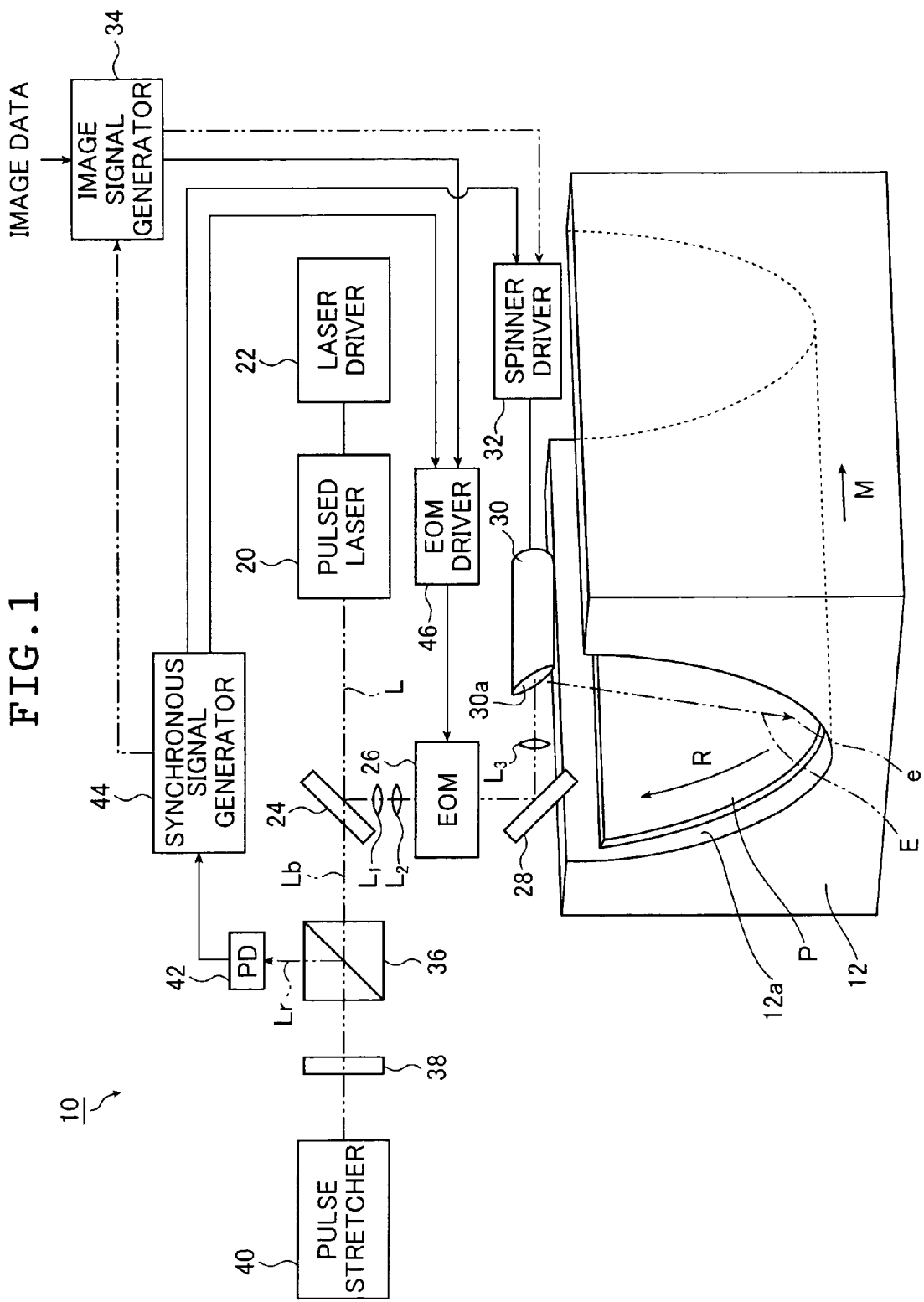
FIG. 1 is a schematic perspective view, partly along with a block diagram, showing an image exposure apparatus according to an embodiment of the present invention.
Figure 2:
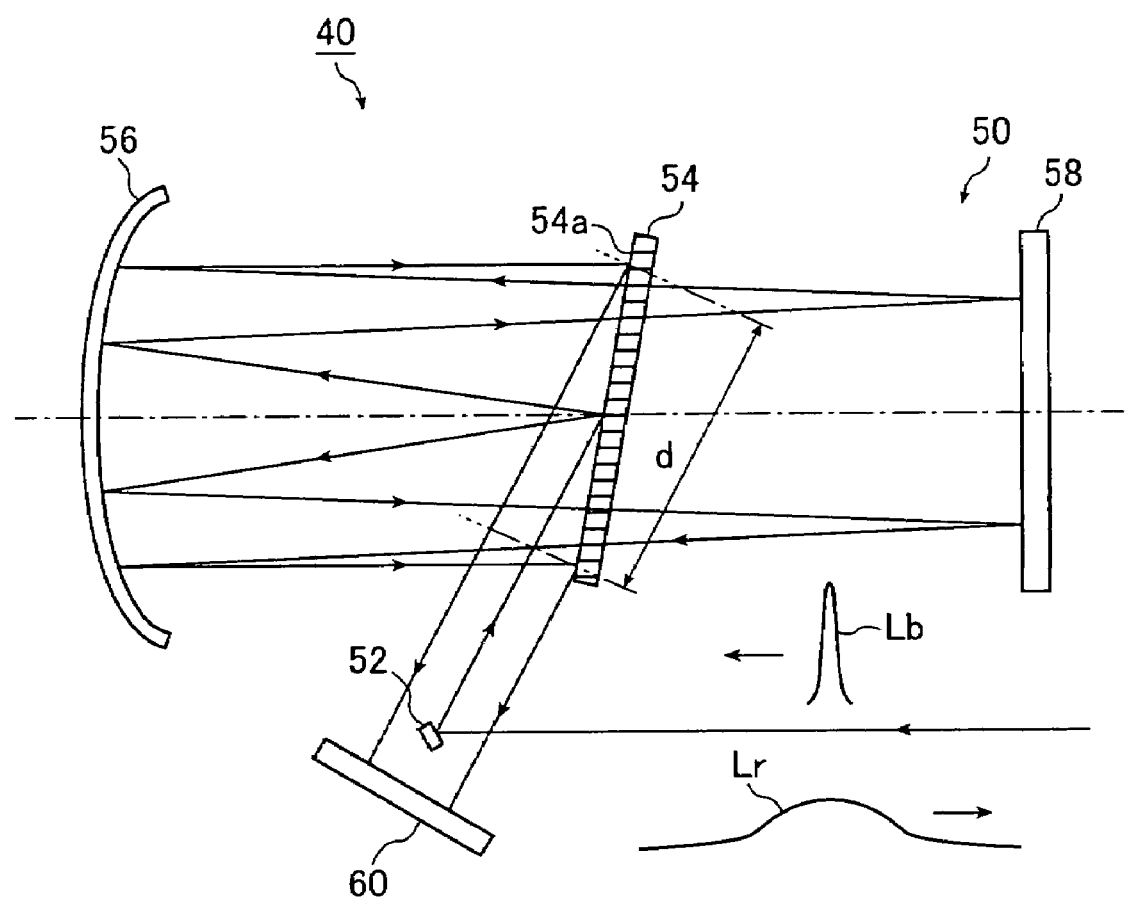
FIG. 2 is a schematic view showing a construction of a pulse stretcher of the image exposing apparatus according to the embodiment of the present invention.

FIG. 1 is a schematic perspective view, partly along with a block diagram, showing an image exposing apparatus according to an embodiment of the present invention, and FIG. 2 is a schematic view showing a construction of a pulse stretcher of the image exposing apparatus according to the embodiment of the present invention.

An image exposing apparatus 10 according to this embodiment is of an inner drum type. A sub scanning direction M in the image exposing apparatus 10 is a direction parallel to an axial direction of a central axis of an inner drum 12. In addition, a main scanning direction R is a direction intersecting perpendicularly the sub scanning direction M.

As shown in FIG. 1, the image exposing apparatus 10 of this embodiment basically includes: an inner drum 12 in which a printing plate precursor P such as a PS plate on which an image or the like is to be recorded is installed on a cylinder inner surface 12a; a pulsed laser 20 (exposing means) for generating a light beam L to be emitted onto the printing plate precursor P; a spinner 30 aligned concentrically with a central axis of the inner drum 12 for scanning the printing plate precursor P with a light beam E; a spinner driver 32 for controlling rotation of the spinner 30; a half mirror 24 and a mirror 28 for making the light beam L emitted from the pulsed laser 20 incident on the spinner 30; an electro-optical modulator (EOM) 26 for modulating the light beam L; branching means for branching the light beam L; a pulse stretcher 40 for stretching a pulse width of a branch beam Lb obtained through the branch by the branching means; synchronous signal generating means; an image signal generator 34; and moving means (not shown) for moving the spinner 30 in the sub scanning direction M. Moreover, in the image exposing apparatus 10 of this embodiment, a beam expander having one set of lens $L_1$ and $L_2$ is disposed between the half mirror 24 and the EOM 26. In addition, a condenser lens $L_3$ is disposed between the mirror 28 and the spinner 30.

Note that in the image exposing apparatus 10 of this embodiment, in order to prevent irregular reflection of the light beam E used to expose the printing plate precursor P, a baffle may be disposed along the cylinder inner surface 12a with a certain gap left above the printing plate precursor P.

The baffle is made of a strip-like plate member, which is provided in the middle of its width with a longitudinal, rectangular opening. The light beam E reflected by the spinner 30 passes through the opening.

The pulsed laser 20 serves to generate the light beam L to be emitted in the pulsed form onto the printing plate precursor P and for example, is a third harmonic generator. The light beam L is emitted in the pulsed form onto the printing plate precursor P with a predetermined pulse repetition period.

In addition, the third harmonic generator, for example, includes a first laser (not shown) for emitting a laser beam having a wavelength of 1,064 nm, a second laser (not shown) for emitting a laser beam having a wavelength of 532 nm, and a nonlinear optical crystal element (not shown). In the pulsed laser 20, the laser beam having the wavelength of 1,064 nm and the laser beam having the wavelength of 532 nm from the first and second lasers, respectively, are made incident on the nonlinear optical crystal element to cause the nonlinear optical crystal element to output an ultraviolet light beam having a wavelength of 355 nm. The pulsed laser 20 has a pulse repetition frequency of 80 MHz for example and has a rated output power of 4 W for example.

In addition, a laser driver 22 is connected to the pulsed laser 20. The laser driver 22 controls the first and second lasers so that the pulsed laser 20 outputs the light beam L having a wavelength of 355 nm.

Note that the wavelength and the output power of the laser beam outputted are not especially limited in the pulsed laser 20, and thus can be suitably set depending on the properties of the printing plate precursor P, the image recording density and the like.

The image signal generator 34 calculates dot data on individual colors of C (cyan), M (magenta), Y (yellow), and K (black) from the image data on an image to be reproduced, determines an image exposure period corresponding to a pixel density for the recording on the printing plate precursor P and an image exposure time for one sheet of printing plate precursor, and generates the modulation data based on the dot data and the image exposure period in the form of image signals. The image signal generator 34 outputs the image signals to either the spinner driver 32 or the EOM driver 46. In addition, when the synchronous signal is inputted to the image signal generator 34, the image signal generator 34 generates image signals using the synchronous signal as the reference clock signal.

The half mirror 24 constitutes a part of the branching means. The half mirror 2-4 serves to make the light beam L incident on the EOM 26, and to transmit a part of the light beam L to make the transmitted light beam incident on a polarizing beam splitter (PBS) 36 which will be described later. In this embodiment, when the light intensity of the light beam L is 4 W for example, the half mirror 24 has only to transmit a part of the light beam L. For this reason, a transmittance of the half mirror 24 does not necessarily need to be 50%, and thus the half mirror 24, for example, may have a reflectivity of 99% and a transmittance of 1%.

The EOM 26 is modulating means for modulating the light beam L emitted in the pulsed form with a predetermined repetition period from the pulsed laser 20 with an image exposure period. The EOM 26 is driven by an EOM driver 46. The EOM driver 46 receives image signals from the image signal generator 34 and a synchronous signal from the synchronous signal generator 44, the signals being described below.

The EOM driver 46 can drive the EOM 26 based on the image signals inputted thereto. When the image signals and the synchronous signal are inputted to the EOM driver 46, the EOM driver 46 uses the synchronous signal as the reference clock signal to regenerate modulation data, in which the image exposure period is made to agree with the synchronous signal period, for each of the inputted image signals related to the respective colors, and drives the EOM 26 in accordance with the modulation data thus regenerated to modulate the light beam L.

The mirror 28 serves to input the modulated light beam L to the spinner 30, and is disposed so as to be symmetric to the half mirror 24 in a vertical direction in FIG. 1.

The spinner 30 has a reflecting surface 30a having an angle of inclination which is set to about 45° with respect to the incidence direction of the light beam L. The modulated light beam L is made incident on the reflecting surface 30a. A motor (not shown) for rotatively driving the spinner 30 upon the axis of the light beam L as the axis of rotation is connected to the spinner 30. The spinner driver 32 controls the rotation of the motor, thereby controlling the rotation of the spinner 30.

After the light beam L emitted from the pulsed laser 20 is expanded to a predetermined size in beam diameter by the beam expander including one set of lens $L_1$ and $L_2$, the expanded light beam L is modulated by the EOM 26, and the modulated light beam L is then condensed on a plate surface of the printing plate precursor P on the inner drum 12 by the condenser lens $L_3$.

For the two-dimensional scanning exposure of the printing plate precursor P, the moving means can move the spinner 30 in the sub scanning direction M along the central axis of the inner drum 12 while keeping the spinner 30 aligned concentrically with the central axis of the inner drum 12. The moving means is not especially limited as long as the moving means can move the spinner 30 along the central axis of the inner drum 12 while keeping the spinner 30 aligned concentrically with the central axis of the inner drum 12.

In addition, when the baffle is provided, since the reflected light beam E from the reflecting surface 30a of the spinner 30 should pass through the opening of the baffle, the baffle is also moved in the sub scanning direction M by a driving means in conjunction with the movement of the spinner 30 so that the light beam E passes through the opening of the baffle.

In addition, in this embodiment, the branching means is constituted by the half mirror 24, the PBS 36, and a quarter wave plate 38. The branching means can make a branch beam Lb obtained through the branch incident on the pulse stretcher 40.

The branch beam Lb obtained through the branch in the half mirror 24 is made incident on the PBS 36 and the quarter wave plate 38. Then, the branch beam Lb transmitted through the PBS 36 is incident on the quarter wave plate 38. The branch beam Lb transmitted through the quarter wave plate 38 is then incident on the pulse stretcher 40. The branch beam Lb is the light beam for generation of the synchronous signal synchronized with the pulse repetition period of the pulsed laser 20.

The PBS 36 can transmit the branch beam Lb, and can reflect a return beam Lr which has been stretched in pulse width by the pulse stretcher 40 in a direction intersecting perpendicularly the traveling direction of the branch beam Lb. A photodetector (PD) 42 is disposed along a direction intersecting perpendicularly the direction of incidence of the branch beam Lb on the PBS 36, i.e., a reflection direction of the return beam Lr. The return beam Lr reflected by the PBS 36 is made incident on the photodetector 42.

Note that in this embodiment, the PBS 36 and the quarter wave plate 38 may be replaced with a half mirror. In this case, the half mirror makes the return beam Lr incident on the photodetector 42.

The pulse stretcher 40 can stretch the pulse width of the branch beam Lb.

FIG. 2 is a schematic diagram showing a construction of the pulse stretcher 40 of this embodiment.

As shown in FIG. 2, the pulse stretcher 40 includes a main body portion 50, and a mirror 52 for making the branch beam Lb incident on the main body portion 50.

The main body portion 50 includes a diffraction grating 54, a concave mirror 56, and a plane mirror 58. The concave mirror 56 and the plane mirror 58 are disposed so as to face each other, with the diffraction grating 54 being located between them. The diffraction grating 54 has a surface 54a on which the branch beam Lb is made incident by the mirror 52. The concave mirror 56 is disposed so as to face the surface 54a of the diffraction grating 54.

The diffracted light obtained through the diffraction in the diffraction grating 54 is reflected by the concave mirror 56. The reflected light is reflected by the plane mirror 58. The resultant reflected light is then reflected by the concave mirror 56 again to be reflected by the surface 54a of the diffraction grating 54. The resultant reflected light is reflected by a plane mirror 60 back to the diffraction grating 54. The plane mirror 60 is disposed in the same direction as the direction where the mirror 52 is arranged with respect to the diffraction grating 54. The plane mirror 60 has a size enough to reflect all the light diffracted by the diffraction grating 54 back to the diffraction grating 54. Note that in FIG. 2, only the plus first-order diffracted light and the minus first-order diffracted light are illustrated as the diffracted light.

In the pulse stretcher 40, the branch beam Lb which has been made incident on the pulse stretcher 40 through the mirror 52 is diffracted by the diffraction grating 54 to be reflected by the concave mirror 56 and the plane mirror 58. The light beam is then diffracted again by the diffraction grating 54 to be incident on the plane mirror 60. The branch beam Lb reflected by the plane mirror 60 travels through the same optical path as that when the branch beam Lb has been made incident on the plane mirror 60 to be finally outputted in the form of the return beam Lr from the pulse stretcher 40 through the plane mirror 52.

The pulse width of the return beam Lr thus outputted is being stretched by a time corresponding to d/c as compared with the branch beam Lb without changing the pulse repetition period. In the above "d/c", d represents the distance between the reflection points on the surface 54a of the two among the rays of light reflected from the concave mirror 56 to the diffraction grating 54 before a further reflection from the diffraction grating 54 to the plane mirror 60, the two rays being most distant from each other, and c represents the light velocity.

Figure 3A:
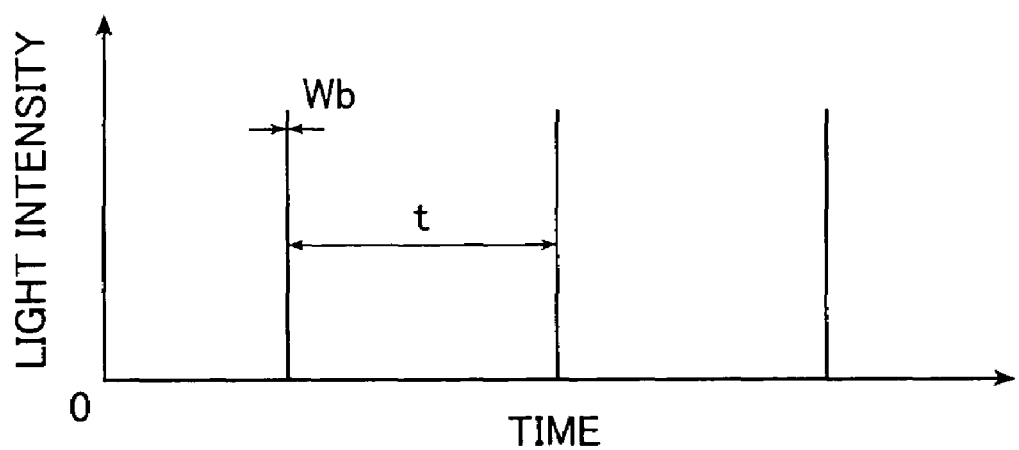
FIG. 3A is a graph showing a pulse train of a branch beam in a coordinate system in which an axis of ordinate represents an intensity of light, and an axis of abscissa represents time.
Figure 3B:
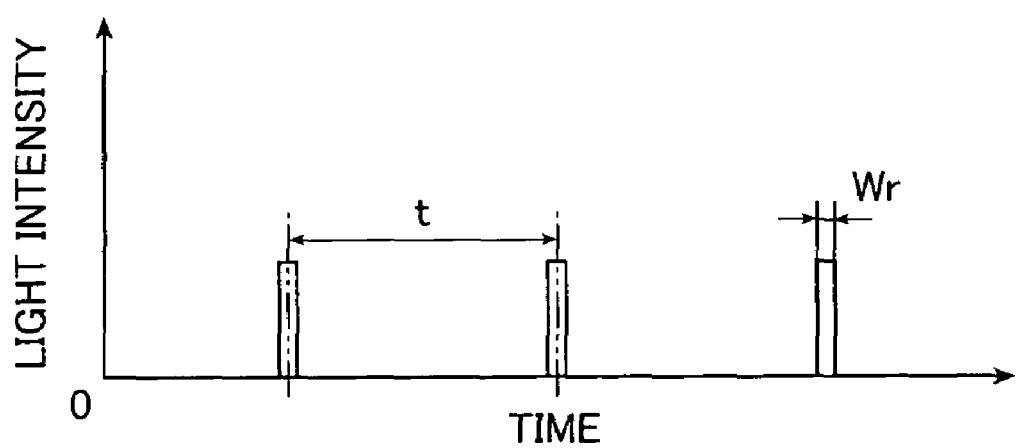
FIG. 3B is a graph showing a pulse train of a return beam in a coordinate system in which an axis of ordinate represents an intensity of light, and an axis of abscissa represents time.

FIG. 3A is a graph showing a pulse train of a branch beam in a coordinate system in which an axis of ordinate represents an intensity of light, and an axis of abscissa represents time, and FIG. 3B is a graph showing a pulse train of a return beam in a coordinate system in which an axis of ordinate represents an intensity of light, and an axis of abscissa represents time.

When a pulse width Wb of the incident branch beam Lb as shown in FIG. 3A is 12 picoseconds for example, a pulse width Wr of the return beam Lr as shown in FIG. 3B becomes 300 picoseconds by means of the pulse stretcher 40. Obtaining the pulse width Wr as shown in FIG. 3B without changing a pulse repetition period t makes the detection of the return beam Lr by the photodetector 42 easier than that in the related art.

In addition, as shown in FIG. 1, the return beam Lr passes through the quarter wave plate 38 to be made incident on the PBS 36. At this time, the return beam Lr is made incident on the photodetector 42 by the PBS 36.

The photodetector 42 serves to detect the return beam Lr. A photoelectric conversion device such as a photoelectric tube, a photocell, a photoconductive cell, a photodiode, a photoresistor, a photoswitch, an avalanche photodiode, or a phototransistor is given as the photodetector 42.

In addition, the synchronous signal generator 44 is connected to the photodetector 42. The synchronous signal generator 44 can generate the synchronous signal synchronized with the pulse repetition period of the pulsed laser 20 based on an output signal from the photodetector 42. The synchronous signal generator 44 is connected to each of the spinner driver 32, the image signal generator 34, and the EOM driver 46.

In the present invention, for example, the pulse width Wb of 12 picoseconds can be stretched to the pulse width Wr of 300 picoseconds. For this reason, even when a low-performance inexpensive photodetector is used as the photodetector 42 instead of using a high-performance photodetector, the return beam Lr can be readily detected. The synchronous signal synchronized with the pulsed laser 20 is generated based on the results of photodetection by the photodetector 42. The synchronous signal is outputted to each of the EOM driver 46 and the image signal generator 34.

In addition, the synchronous signal may be outputted from the synchronous signal generator 44 to the spinner driver 32 to rotate the spinner 30 in synchronism with the synchronous signal, i.e., with the modulation operation of the EOM 26.

In this embodiment, even when for example, the pulse repetition frequency is 80 MHz and the pulse width is 12 picoseconds, the pulse stretcher 40 stretches the pulse width of 12 picoseconds to the pulse width of 300 picoseconds for example, whereby the synchronous signal can be readily generated with a simpler construction than that in the related art. As a result, the image exposure can be carried out synchronously with the synchronous signal synchronized with the pulse repetition period of the pulsed laser 20, i.e., synchronously with the output period of the pulsed laser 20. Thus, the image exposure can be carried out on the printing plate precursor P without the interference between the pulse repetition period and the image exposure period. As a result, a proper image exposure can be carried out in the exposing apparatus using a high-speed pulsed laser such as a UV laser without the interference between the pulse repetition period and the image exposure period of the scanning exposure.

In addition, though the high-efficiency UV laser has a very narrow pulse width of 12 picoseconds for example, in this embodiment, the pulse stretcher 40 stretches the pulse width of the branch beam that is to be detected by the photodetector 42. As a result, since the signal strength of the photodetector 42 and the electronic circuit which are used to generate the synchronous signal can be sufficiently stabilized, the precision of synchronization with the image exposure period can be enhanced and thus the excellent image performance can be obtained.

Moreover, in this embodiment, since the pulse width of the branch beam that is to be detected by the photodetector 42 is stretched to 300 picoseconds for example, the branch beam can be surely detected by the photodetector 42. Thus, even when the synchronous signal generator 44 is configured with a circuit which operates at a sampling frequency of about 3 GHz, the synchronous signal can be surely generated. For this reason, the photodetector 42 and the electronic circuit can be made simpler and more inexpensive than those in the related art.

Next, an image exposing method according to this embodiment of the present invention will be described.

First, the pulsed laser 20 is driven by the laser driver 22 to emit the light beam L having the pulse repetition frequency of 80 MHz (repetition period of 12.5 ns) and the pulse width of 12 picoseconds for example, in the pulsed form.

Next, the pulse width of the branch beam Lb obtained through the branch by the half mirror 24 is stretched, for example, from 12 picoseconds to 300 picoseconds by the pulse stretcher 40. The return beam Lr outputted from the pulse stretcher 40 is detected by the photodetector 42. The return beam Lr is repetitively detected by the photodetector 42 so that the synchronous signal generator 44 generates the synchronous signal synchronized with the pulse repetition period of the light beam L which is outputted in the form of the pulses with a predetermined pulse repetition period by the pulsed laser 20.

On the other hand, modulation data are generated from the dot data on the respective colors of C (cyan), M (magenta), Y (yellow), and K (black) based on the image data, using the image exposure period determined from the pixel density and the image exposure time for one sheet of the printing plate precursor P as the reference clock. The modulation data, as being the image signals for the above respective colors, are then outputted to the EOM driver 46.

Next, the synchronous signal generator 44 outputs the synchronous signal to each of the spinner driver 32 and the EOM driver 46.

At this time, the EOM driver 46 regenerates modulation data, in which the image exposure period is made to agree with the inputted synchronous signal, for each of the inputted image signals related to the respective colors as above, using the synchronous signal as the reference clock signal. Then, the EOM driver 46 drives the EOM 26 based on the modulation data to modulate the light beam L. The image exposure is carried out using the modulated light beam L.

In this case, since the synchronous signal is also inputted to the spinner driver 32, the timing of the rotation of the spinner 30 is being synchronized with the timing of the modulation (timing of the image exposure).

In this state, the modulated light beam L is reflected by the mirror 28 to be incident on the reflecting surface 30a of the spinner 30. At this time, the spinner 30 is rotating and the modulated light beam L is reflected by the reflecting surface 30a of the spinner 30. The printing plate precursor P is thus scanned in the main scanning direction R with the light beam E as the reflected light beam L.

At this time, the rotating spinner 30 allows the irradiation of the printing plate precursor P with the light beam E rapidly moved in the main scanning direction R and, consequently, the scanning thereof in the main scanning direction R. Since the spinner 30 is moved by the moving means in the sub scanning direction M during its rotation, the printing plate precursor P is two-dimensionally scanned and exposed with the light beam E which has been modulated in accordance with the image signals. As a result, the image exposure of the printing plate precursor P is carried out to form a latent image at an exposure position e of the printing plate precursor P.

As described above, in this embodiment, the EOM (modulator) 26 and the rotation of the spinner (deflector) 30 are controlled with the synchronous signal as the reference clock signal. Hence, the image exposure period of the image exposure, and the pulse repetition period of the pulsed laser are synchronized with each other, and thus do not interfere with each other. For this reason, scanning exposure for an image to be reproduced can properly be achieved, and thus a latent image can be formed on the printing plate precursor P.

In addition, in the image exposing method of this embodiment, a procedure may also be adopted in which the synchronous signal is outputted to the image signal generator 34, an image signal is generated by the image signal generator 34 using the synchronous signal as the reference clock signal, and the image signal is outputted to each of the spinner driver 32 and the EOM driver 46 to subject the printing plate precursor P to image exposure. In this case as well, since image signals are synchronized with the pulse repetition period, the image exposure period and the pulse repetition period do not interfere with each other and also do not interfere with the rotation of the spinner 30, i.e., the exposure timing. Thus, the image exposure can be properly carried out.

Note that in this embodiment, a mode-locked laser for emitting a laser beam having a wavelength of 355 nm for example is used as the pulsed laser 20. The pulsed laser 20 has a rated laser output power (average output power) of 4 W, and has a laser light source power of 2.7 W. Also, the pulsed laser 20 has the pulse repetition frequency of 80 MHz, and has the pulse width of 12 picoseconds.

In addition, the inner drum 12 has a radius of 255 mm, and the spinner 30 has a rotating speed of 31,750 rpm. Since the image exposing apparatus 10 of this embodiment utilizes the inner drum system, the scanning efficiency is 50%.

A high-sensitivity negative PS plate, for example, is used as the printing plate precursor P. The printing plate precursor P is 800 mm in length in the main scanning direction R and 1,030 mm in length in the sub scanning direction M, and has an exposure of 10 $mJ/cm^2$.

When in the image exposing apparatus 10 of this embodiment, the pixel density (resolution) in the main scanning direction R and in the sub scanning direction M is 2,400 dot per inch (dpi), the pixel pitch is 10.58 μm.

In addition, when in the image exposing apparatus 10 of this embodiment, one sheet of the printing plate precursor P is exposed for 3 minutes, an exposure time required per pixel becomes about 10 ns. At this time, if a feeding and discharging time required for the printing plate precursor P is 30 seconds, the productivity of the image exposing apparatus 10 of this embodiment becomes 17 sheets per hour.

It should be noted that the exposing means used in the present invention emits a light beam not continuously but in a pulsed form. The reason for this will be given below on the supposition that the light beam emitted continuously and that emitted in a pulsed form are each a Gaussian beam.

If an area corresponding to two adjacent pixels in the printing plate precursor P is scanned and exposed with the continuously emitted light beam, the area will be irradiated with the light beam continuously during the exposure. In that case, the amount of the light used for the exposure of the printing plate precursor P for the area corresponding to the two pixels is found as the integral with respect to time, and the area corresponding to the two pixels are so formed as to be equivalent to an area corresponding to one pixel formed by the exposure with the light beam of a larger diameter. In other words, in the case of the image exposure using the continuously emitted light beam, the area corresponding to the two adjacent pixels formed appear as if one, with the resolution being thus reduced.

On the other hand, if the printing plate precursor P is scanned and exposed for an area corresponding to two adjacent pixels using the pulsed light beam, in which the scanning is performed at the same speed as in the above scanning exposure using the continuously emitted light beam, the area will be irradiated with the light beam twice at a specified time interval. In that case, the light beam is used for the image exposure of the printing plate precursor P for each area corresponding to each pixel separately, that is to say, the area corresponding to the two pixels are separately exposed for each area corresponding to each pixels. Accordingly, in the case of the image exposure using the pulsed light beam, the reduction in resolution is suppressed.

Thus, when a dot image is recorded on the printing plate precursor P with the continuously emitted light beam, if a fluctuation occurs in quantity of light, or a fluctuation occurs in sensitivity of the printing plate precursor P, a dot size changes. For this reason, the density in the finally obtained printed products changes, and thus the stable image quality can not be obtained.

On the other hand, in the case of the pulsed light beam, the high resolution is obtained, and no image exposure is carried out in which two pixels formed appear as if one. Thus, a fluctuation in size of the dot formed through the image exposure is small irrespective of the occurrence of the fluctuation in quantity of light, or the fluctuation in sensitivity of the printing plate precursor P. For this reason, a possibility that the density nonuniformity or the like occurs in the finally obtained image becomes low, and thus the stable image quality can be obtained.

As described above, the pulsed light beam has a higher resolution in the image exposure than the continuously emitted light beam, and the former provides a more excellent frequency response than the latter when used for the image exposure at the same frequency. For this reason, in this embodiment, the pulsed laser is used in the image exposing apparatus.

In addition, in the present invention, the modulating means is not limited to the EOM 26. That is, an acousto-optic modulator (AOM), a spatial modulation element or the like may also be used as the modulating means. In addition, the deflector is not limited to the spinner 30. That is, a polygon mirror, a galvano-mirror, a resonant scanner or the like may also be used as the deflector.

Moreover, the present invention is not intended to be limited to the image exposing apparatus of an inner drum type shown in this embodiment. Thus, the present invention may also be applied to an image exposing apparatus of an outer drum type and an image exposing apparatus of a flat bed type each of which serves to carry out the two-dimensional scanning exposure. Even when the present invention is applied to the image exposing apparatus of an outer drum type and the image exposing apparatus of a flat bed type as described above, it is possible to obtain the same effects as those in the case of the image exposing apparatus of an inner drum type described in this embodiment.

The present invention is basically as described above. The image exposing apparatus and the image exposing method of the present invention have been described so far in detail, it is to be understood that the present invention is not intended to be limited to the above-mentioned embodiment, and thus the various improvements and changes may be made without departing from the gist of the present invention.

In addition, while in the above-mentioned embodiment, the image exposure is carried out on the printing plate precursor P, the present invention is not intended to be limited thereto. That is, the present invention can also be applied to, for example, a film setter for exposing a lith film, and an exposing apparatus used to manufacture a PCB.

What is claimed is:

1. An image exposing apparatus for two-dimensionally scanning a printing plate precursor with a light beam modulated based on an image signal to carry out image exposure on the printing plate precursor, said image exposing apparatus comprising:

exposing means for emitting a light beam in a pulsed form with a predetermined pulse repetition period onto said printing plate precursor;

branching means for branching at least a part of said light beam emitted from said exposing means;

a pulse stretcher for stretching a pulse width of a branch beam branched by said branching means;

synchronous signal generating means for generating a synchronous signal synchronized with said pulse repetition period of said light beam from said branch beam having the pulse width stretched by said pulse stretcher; and modulating means for modulating said light beam emitted from said exposing means with an image exposure period synchronized with said synchronous signal.

2. An image exposing method for two-dimensionally scanning a printing plate precursor with a light beam modulated based on an image signal to carry out image exposure on the printing plate precursor, said image exposing method comprising the steps of:

branching at least a part of said light beam to be emitted in a pulsed form with a predetermined pulse repetition period to generate a branch beam;

stretching a pulse width of said branch beam;

detecting said branch beam having said stretched pulse width;

generating a synchronous signal synchronized with said light beam emitted in the pulsed form with said predetermined pulse repetition period based on said detected branch beam; and modulating said light beam with an image exposure period synchronized with said synchronous signal.

* * * * *